(12) United States Patent
Yang et al.

(10) Patent No.: US 9,606,274 B2
(45) Date of Patent: Mar. 28, 2017

(54) RED PHOTORESIST COMPOSITION, METHOD OF PREPARING THE SAME, COLOR FILTER, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Yiming Zhao, Beijing (CN); Xiao Sun, Beijing (CN); Bing Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 364 days.

(21) Appl. No.: 14/387,785

(22) PCT Filed: Dec. 20, 2013

(86) PCT No.: PCT/CN2013/090071
§ 371 (c)(1),
(2) Date: Sep. 24, 2014

(87) PCT Pub. No.: WO2014/176921
PCT Pub. Date: Nov. 6, 2014

(65) Prior Publication Data
US 2016/0238754 A1 Aug. 18, 2016

(30) Foreign Application Priority Data
Apr. 28, 2013 (CN) .......................... 2013 1 0156670

(51) Int. Cl.
G03F 7/027 (2006.01)
G02B 5/20 (2006.01)
G03F 7/00 (2006.01)
G03F 7/033 (2006.01)
G03F 7/105 (2006.01)
G03F 7/028 (2006.01)
G02B 5/22 (2006.01)

(52) U.S. Cl.
CPC .............. *G02B 5/208* (2013.01); *G02B 5/201* (2013.01); *G02B 5/223* (2013.01); *G03F 7/0007* (2013.01); *G03F 7/027* (2013.01); *G03F 7/028* (2013.01); *G03F 7/033* (2013.01); *G03F 7/105* (2013.01)

(58) Field of Classification Search
CPC ........ G03F 7/0007; G03F 7/027; G03F 7/028; G03F 7/033; G03F 7/105; G02B 5/201; G02B 5/223; G02B 5/208; G02F 1/133512; G02F 1/133516
USPC ......................... 430/7, 270.1, 281.1; 349/106
See application file for complete search history.

(56) References Cited

U.S. PATENT DOCUMENTS

2010/0081070 A1* 4/2010 Taguchi ............... C08K 5/0041
430/7
2014/0319421 A1* 10/2014 Kwon .................. C09K 11/025
252/301.35

FOREIGN PATENT DOCUMENTS

EP 0 543 671 A * 5/1993

OTHER PUBLICATIONS

International Preliminary Report on Patentability issued on Nov. 3, 2015; PCT/CN2013/090071.

* cited by examiner

*Primary Examiner* — John A McPherson
(74) *Attorney, Agent, or Firm* — Ladas & Parry LLP

(57) ABSTRACT

A red photoresist composition capable of emitting infrared light, a method of preparing the red photoresist composition capable of emitting infrared light, a color filter comprising red sub-pixels formed from the red photoresist composition capable of emitting infrared light, and a display device including the color filter. The red photoresist composition capable of emitting infrared light comprises, based on the total weight of the composition, 2% to 20% of a color mixed material, 30% to 90% of a solvent, 2% to 20% of an alkali-soluble resin, 2% to 20% of an ethenoid unsaturated monomer, 0.01% to 1% of photoinitiator, and 0.005% to 0.02% of other additives; wherein the color mixed material includes a colorant and a surface-modified infrared light-emitting material at a weight ratio of 99.95:0.05 to 1:1.

20 Claims, No Drawings

RED PHOTORESIST COMPOSITION, METHOD OF PREPARING THE SAME, COLOR FILTER, AND DISPLAY DEVICE

TECHNICAL FIELD

Embodiments of the present invention relates to a red photoresist composition capable of emitting infrared light, a method of preparing the red photoresist composition capable of emitting infrared light, a color filter comprising red sub-pixels formed from the red photoresist composition capable of emitting infrared light, and a display device comprising the color filter.

BACKGROUND

Over the rapid development of display techniques, customers require a display device to not only have a clear and emulational display effect, but also to exhibit multi-functionality, such as, recreational and healthy functions.

Conventional display devices achieve color display by means of conventional color filters. Conventional color filters utilize a red photoresist material comprising components like colorants for providing a color, ethenoid unsaturated monomers, alkali-soluble resins, solvents, photoinitiators, and the like.

It is well known that far-infrared light exhibits relative strong penetrability and radiation, has remarkable temperature-controlling effect and resonant effect. After absorption by human bodies, far-infrared light can be resonated with in vivo water molecules to activate the water molecules and improve the inter-molecular binding force, thereby activating biological macromolecules like proteins, etc, and allowing cells in organisms to be at the highest vibrational levels. Due to the resonant effect of biological cells, far-infrared heat energy can be transferred to a deeper subcutaneous site so that the temperature of deep zone increases and the produced warm diffuses from the inside out. Such effect expands capillary vessels, facilitates blood circulation, enhances metabolism among various tissues, increases regeneration capacity of tissues, improves immunity of bodies, and adjusts abnormally excited mental state, thereby producing therapeutic and health caring effect.

Based on the above described requirements and technical background, a red photoresist composition further having an function of emitting infrared light is developed on the basis of conventional red photoresist materials so that the display device produced therefrom can have both conventional display effect and therapeutic and health caring effect.

SUMMARY

An embodiment of the present invention provides a red photoresist composition capable of emitting infrared light, which can not only emit a sufficient amount of infrared light, but also maintain conventional display properties, such as, optical density, chromaticity, etc., thereby achieving both health caring and display.

In an embodiment of the present invention, the red photoresist composition capable of emitting infrared light comprises, based on the total weight of the composition, 2% to 20% of a color mixed material, 30% to 90% of a solvent, 2% to 20% of an alkali-soluble resin, 2% to 20% of an ethenoid unsaturated monomer, 0.01% to 1% of a photoinitiator, and 0.005% to 0.02% of other additives; wherein, the color mixed material comprises a colorant and a surface-modified infrared light-emitting material at a weight ratio of 99.95:0.05 to 1:1.

In an aspect of the present invention, the color mixed material can comprise 5 to 18 wt % of the total weight of the composition.

In another aspect of the present invention, the color mixed material comprises the colorant and the surface-modified infrared light-emitting material at a weight ratio of 17.5:1 to 1:1, e.g., a weight ratio of 10:1 to 1:1.

In another aspect of the present invention, the infrared light-emitting material is one or more selected from the group consisting of tourmaline, biological carbon, far-infrared ceramics, bowlder powders, alumina, copper oxide, silver oxide and silicon carbide.

In another aspect of the present invention, the infrared light-emitting material is subject to surface modification with a polymeric material.

The polymeric material is a methyl methacrylate-co-styrene-co-maleimide copolymer.

The surface-modified infrared light-emitting material has a mean particle diameter of 1 nm to 200 nm.

In another aspect of the present invention, the tourmaline is red tourmaline having a density of 3.06 to 3.26 g/cm$^3$ and a refraction index of 1.62 to 1.64.

Another embodiment of the present invention provides a method of preparing a red photoresist composition capable of emitting infrared light comprising:

grinding and dispersing an infrared light-emitting material into a solvent to give a nano-dispersion comprising infrared light-emitting material nanoparticles having a mean particle diameter of 1 nm to 200 nm;

surface-modifying the infrared light-emitting material nanoparticles in the nano-dispersion with a polymeric material, followed by removing the solvent, to give polymeric material-modified infrared light-emitting material nanoparticles;

mixing the polymeric material-modified infrared light-emitting material nanoparticles with a colorant to give a color mixed material, and mixing the color mixed material with a solvent, an alkali-soluble resin, an ethenoid unsaturated monomer, a photoinitiator, and other additives to give the red photoresist composition capable of emitting infrared light.

Another embodiment of the present invention provides a color filter comprising red sub-pixels from the aforesaid red photoresist composition capable of emitting infrared light.

Another embodiment of the present invention provides a display device comprising the aforesaid color filter.

The display device made from the red photoresist composition capable of emitting infrared light can not only emit a sufficient amount of infrared light, but also maintain original display properties like optical density (OD) value, etc., thereby achieving both health caring and display.

DETAILED DESCRIPTION

An embodiment of the present invention provides a red photoresist composition capable of emitting infrared light, comprises, based on the total weight of the composition, 2% to 20% of a color mixed material, 30% to 90% of a solvent, 2% to 20% of an alkali-soluble resin, 2% to 20% of an ethenoid unsaturated monomer, 0.01% to 1% of a photoinitiator, and 0.005% to 0.02% of other additives.

In the red photoresist composition capable of emitting infrared light of the embodiments of the present invention, the color mixed material comprises 2 to 20% of the total weight of the composition, preferably, 5% to 20%, more preferably 5% to 18%.

In the red photoresist composition capable of emitting infrared light of the embodiments of the present invention, the aforesaid color mixed material comprises the colorant and the surface-modified infrared light-emitting material at a weight ratio of 99.95:0.05 to 1:1, preferably 17.5:1.5 to 1:1, more preferably 10:1 to 1:1.

The aforesaid colorant can be red, organic, or yellow pigments or dyes, or a mixture of two or more thereof.

The examples of the aforesaid pigments can comprise: organic pigments, such as, azos, pyrazolones, benzidines pigments, e.g., P.O.5, P.O.13, P.O.16, P.O.34, P.O.36, P.O.48, P.O.49, P.O.71 or P.O.73, etc.; yellow pigments, such as, azos, azo condensation type, and heterocyclic pigments, e.g., P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.147, P.Y.150, P.Y.174 or P.Y.180, etc.; red pigments, such as, P.R.122, P.R.123, P.R.177, P.R.179, P.R.190, P.R.202, P.R.210, P.R.224, P.R.254, P.R.255, P.R.264, P.R.270, P.R.272, P.R.122, etc.

The examples of the aforesaid dyes can comprise: C.I. Basic Yellow 2; C.I. Solvent Yellow 34; C.I. Basic Orange 2; C.I. Solvent Green 1; Y-27; Y-44; Y-50; Y-86; Y-106; Y-120; Y-132; Y-6; Y-11; Y-119; Y-23; Y-4; C.I. Direct R80; C.I. Direct R83; C.I. Solvent R49, C.I. Solvent R5B; C.I. Solvent R49; R-80; R-81; R-83; R-239; R-254; R-153; R-135; R-74.

The aforesaid infrared light-emitting material is a material which can produce infrared light through heat exchange, and the examples thereof can comprise one or more selected from the group consisting from the group consisting of tourmaline ([Na,K,Ca][Mg,F,Mn,Li,Al]3[Al,Cr,Fe,V]6 [BO3]3[Si6O18][OH,F]4), biological carbon, far-infrared ceramics, bowlder powders, alumina, copper oxide, silver oxide and silicon carbide. The infrared light-emitting material can have a mean particle diameter of 1 nm to 200 nm, preferably 5 nm to 150 nm, more preferably 10 nm to 100 nm, and most preferably 25 nm to 75 nm.

The infrared light-emitting material is preferably tourmaline, biological carbon, alumina or silicon carbide. Of those, the tourmaline is preferably red tourmaline having a hardness of 7 to 7.2, a density of 3.06 to 3.26 g/cm$^3$, and a refraction index of 1.62 to 1.64.

The aforesaid infrared light-emitting material without surface modification cannot be used in the embodiments of the present invention because the incompatibility of such unmodified material with the organic resin component and the pigment component in the red photoresist composition system is likely to cause the precipitation and phase separation of the photoresist composition, thereby resulting in the deterioration of properties of the photoresist material and affecting the uniformity of display effect. Prior to use, the aforesaid infrared light-emitting material is subject to surface modification to modify its surface morphometry and grain boundary structure, thereby changing the activity of material, increasing its heat exchange capacity, and enabling it to emit far-infrared light having a specific wavelength at a high specific radiance.

The surface modification of the infrared light-emitting material can comprise:

1) Grinding and dispersing the infrared light-emitting material into a solvent to give a nano-dispersion comprising the infrared light-emitting material nanoparticles having a mean particle diameter of 1 nm to 200 nm. The primary object of this step is to nano-crystallize the infrared light-emitting material to give infrared light-emitting material nanoparticles. The grinding and dispersing can be achieved with conventional methods for preparing nano materials, e.g., they can be achieved with conventional grinding equipments (such as, ball grinder, sand mill, etc.) and dispersants in an organic solvent. Based on the total weight of the nano-dispersion, the infrared light-emitting material can comprise 10 to 15 wt % of the nano-dispersion.

2) Subjecting the nano-crystallized infrared light-emitting material to a further surface modification. The primary object of this step is to modify the surface characteristics of the dispersed nanoparticles in step 1) so that these modified nanoparticles can be compatible with the red photoresist composition system. The step comprises, in particular:

dissolving azo initiators (such as, azobisisovaleronitrile, azobisisobutyronitrile, azobisisocapronitrile, azobisisoheptanenitrile, etc.) in an organic solvent for use in next step;

charging the nano-dispersion of the infrared light-emitting material into a four-neck flask, while stirring, vibrating (at a frequency of more than 50 Hz) or shaking the nano-dispersion;

adding an solution of monomers methyl methacrylate, styrene, and maleimide (1:1-2:1-2/mol) in an organic solvent (monomer:solvent=1:1-3/vol) into the aforesaid four-neck flask, wherein the infrared light-emitting material comprises 8-25% of the mixed solution in the four-neck flask, preferably 10 to 20%, and more preferably 12 to 17%;

adding an solution of azo initiators into the aforesaid four-neck flask in an amount of 1-5% based on the total weight of monomers at a temperature of 35° C. to 60° C. and under nitrogen protective atmosphere, and reacting the mixture under stirring, vibrating, or shaking for 30 min to 90 min;

after completion of reaction, adding an organic solvent at 5 to 10° C. for cooling, while stirring the reaction mixture until the reaction product cools to room temperature;

after filtration, washing the filtered solids with the aforesaid organic solvent three times, and drying the solids at 70 to 100° C. for 5 to 20 min, to give the surface-modified infrared light-emitting material.

The solvent used in the aforesaid steps c can be one or more of fatty alcohol, ethylene glycol ether, ethyl acetate, methyl ethyl ketone, methyl isobutyl ketone, monomethyl ether ethylene glycol ester, γ-butyraolactone, ethyl 3-ethoxypropriate, butylcarbitol, butyl carbitol acetate, propylene glycol monomethyl ether, propylene glycol monomethyl ether acetate, cyclohexane, xylene, and isopropanol.

The dispersant used in the above steps can be conventional dispersing agents, e.g., BYK 410, BYK 110, BYK 163, BYK 161, BYK 2000, BYK SYNEGIST 2150, CN2284, Solsperse32500, Solsperse22000, and the like. The dispersant can comprise 5-15 wt % of the nano-dispersion, preferably 7 to 12%.

In the red photoresist composition capable of emitting infrared light of the embodiments of the present invention, the solvent can comprises 30-90 wt % of the total weight of the composition, preferably 40-90 wt %, and more preferably 45-90 wt %. The solvent can be one or more selected from the group consisting of acidic solvents, basic solvents, and neutral solvents. The examples of acidic solvents can comprise formic acid, acetic acid, chloroform, or the like. The examples of basic solvents can comprise some basic ketones, esters, ethers, or certain aromatic hydrocarbons, etc. The examples of neutral solvents can comprise fatty alcohol, ethylene glycol ether, ethyl acetate, methyl ethyl ketone, methyl isobutyl ketone, monomethyl ether ethylene glycol ester, γ-butyraolactone, ethyl 3-ethoxypropriate, butylcarbitol, butylcarbitol acetate, propylene glycol monomethyl ether, propylene glycol monomethyl ether acetate, cyclohexane, xylene, isopropanol, and the like. Preferably, the solvent can be propylene glycol monomethyl ether, propylene glycol monomethyl ether acetate, cyclohexane, butylcarbitol, butylcarbitol acetate or γ-butyraolactone, or their mixture.

In the red photoresist composition capable of emitting infrared light of the embodiments of the present invention, the alkali-soluble resin can comprise 2 wt % to 20 wt % based on the total weight of the composition, preferably 5 wt % to 20 wt %, and more preferably 5 wt % to 15 wt %. The alkali-soluble resin can be aromatic acid (meth)acrylic acid semi-ester (e.g., SB401, SB404 available from Sartomer Co., Ltd.), a copolymer of styrene and maleic anhydride, or any combination thereof.

In the red photoresist composition capable of emitting infrared light of the embodiments of the present invention, the monomer can be ethenoid unsaturated monomer, and comprise 2 wt % to 20 wt % of the total weight of the composition, preferably 5 wt % to 20 wt %, and more preferably 5 wt % to 15 wt %. The ethenoid unsaturated monomer can be ethenoid chloride, styrene, methyl methacrylate, maleimide, butadiene, methyl acrylate, epoxy acrylate, bisphenol A-type methyl epoxy acrylate, multi-functional (meth)acrylate monomers (e.g., ethoxylated trimethoxypropane triacrylate, pentaerythritol, etc.), or any combination thereof.

In the red photoresist composition capable of emitting infrared light of the embodiments of the present invention, the photoinitiator can comprise 0.01 wt % to 1 wt % of the total weight of the composition, wherein the photoinitiator can be α-aminoketone-based photoinitiators, such as, Irgacure 907, Igracure 369, Irgacure 1300; or acylphosphine oxide photoinitiator, such as, Irgacure 819, Irgacure 819DW, Irgacure 2010, Darocur TPO, Darocur 4265; α-hydroxyketone-based photoinitiator, such as, Darocur 1173, Irgacure 184, Irgacure 2959, Irgacure 500, Irgacure 1000; or phenylglyoxylic acid-based photoinitiator, such as, Darocur MBF, Irgacure 754; oxyacyloxime ester-based photoinitiator, such as, OXE-01, OXE-02, Quanta cure PDO; or any mixture thereof.

In the red photoresist composition capable of emitting infrared light of the embodiments of the present invention, the other additives can comprise 0.005 wt % to 0.02 wt % of the total weight of the composition, preferably 0.005 wt % to 0.015 wt %, and more preferably 0.005 wt % to 0.01 wt %, wherein the additives can be adhesion promoters, leveling agents, defoaming agents, photo-stabilizers, and the like.

A colorant is mixed with the surface-modified infrared light-emitting material at a weight ratio of 99.95:0.05 to 1:1 to give the color mixed material.

The aforesaid color mixed material, solvent, alkali-soluble resin, ethenoid unsaturated monomer, photoinitiator, and other additives are homogenously with the aforesaid amounts by means of, e.g., stirring, shaking, or the like, thereby preparing the red photoresist composition capable of emitting infrared light of the embodiments of the present invention. Thus, the red photoresist composition comprising the aforesaid components can not only maintain conventional display properties like chromaticity, transmissivity, etc., but also emit far-infrared light with a wavelength ranging from 5 to 15 microns and a specific radiance ranging from 0.35 to 0.95 so as to provide a health caring effect.

EXAMPLES

The raw materials used in each examples are listed as follows:
A, Colorant: P.R. 254 (Ciba Special Chemicals)
B, Infrared Light-emitting Material:
B-1: red tourmaline: density: 3.06 g/cm$^3$, refraction index: 1.62, hardness: 7
B-2: biological carbon: purity: greater than 99%
B-3: alumina: purity: greater than 99.9%
C, Dispersant
C-1: BYK 161 (BYK)
C-2: BYK 2000 (BYK)
C-3: SYNEGIST 2150 (BYK)
C-4: CN 2284 (Sartomer)
D, Alkali-Soluble Resin
D-1: SB 401 (Sartomer)
D-2: SB 404 (Sartomer)
E, Ethenoid Unsaturated monomer
E-1: Ethoxylated trimethoxypropane triacrylate SR 494 (Sartomer)
E-2: pentaerythritol tetraacrylate SR295 (Sartomer)
F, Other Additives
F-1: wetting agent Coatosil 1211 (GE)
F-2: leveling agent EB 350 (Cytex)
F-3: leveling agent BYK 378 (BYK)
G, Intiator
G-1: Irgacure 184 (Ciba Special Chemicals)
G-2: Irgacure 369 (Ciba Special Chemicals)
H, Solvent
H-1: propylene glycol monomethyl ether acetate (PMA)
C-2: ethyl 3-ethoxypropriate (EEP)
C-3: n-butanol (n-BuOH)

Preparation of Color Mixed Material

Example 1

5 g of a dispersant, BYK 161, were added into 95 g of a solvent, propylene glycol monomethyl ether acetate (PMA), and then 11.1 g of alumina particles were added. The resultant mixture was stirred to be homogeneous, and ground to allow the formed nanoparticles of alumina to have a mean diameter of 17 nm, thereby producing an alumina nano-dispersion.

Monomers, methyl methacrylate, styrene, and maleimide (1:1:1/mol), were dissolved in a solvent PMA (monomer:solvent=1:1/vol), and then 27.7 g of the resultant solution was charged into a four-neck flask equipped with stirrer, thermometer, purge tube, and drop funnel so that the alumina comprised 8% of the weight of the mixed solution.

Azobisisovaleronitrile was dissolved into PMA to produce a saturated solution of azobisisovaleronitrile in PMA, and the weight percent upon complete dissolution was recorded. Nitrogen was purged into the aforesaid four-neck flask at 35° C. The saturated solution of azobisisovaleronitrile in PMA as produced above was added with stirring in an amount to allow the net content of the azobisisovaleronitrile as initiator to be 1% of the total net content of the aforesaid monomer, and the reaction was kept for 30 min. After completion of reaction, 100 mL PMA at 5° C. was added with stirring to cool the reaction products to room temperature.

The aforesaid reaction products were filtered. The filtered solids were washed with 50 ml PMA three times, and dried at 90° C. for 15 min, thereby obtaining alumina particles modified with methyl methacrylate-co-styrene-co-maleimide copolymer and having having a mean particle diameter of 24 nm.

Red pigment P.R. 254 was mixed with the aforesaid modified alumina particles at a weight ratio of 99.95:0.05 to produce a color mixed material-1.

Example 2

Color mixed material-2 to color mixed material-10 were prepared in accordance with the same method as Example 1, except that the mixing ratio of the red pigment P.R. 254 to the modified infrared light-emitting material were shown in Table 1.

Preparation of Red Photoresist Composition

Example 3

8 g of SYNEGIST 2150, 75 g of BYK 2000, 40 g of CN 2284 and 423.5 g of the solvent PMA were mixed homogeneously by means of stirring to produce a dispersant solution. To this solution, 100 g of the color mixed material-1 prepared in Example 1 was added, and the mixture was stirred to moisten sufficiently the pigment to produce a mixed solution. The mixed solution was ground and dispersed with a sand mill to produce a color mixed material dispersion-1, which comprised 15.5 wt % of the color mixed material-1.

The alkali-soluble resins D-1 (5%) and D-2 (4.5%), the ethenoid unsaturated monomer E-2 (13.8%), the photoinitiator G-2 (0.015%) and the other additives F-1 (0.006%), F-2 (0.006%), and F-3 (0.006%) were added into a mixed solvent comprising the solvent H-2 (20%), and stirred until these components were thoroughly dissolved to produce a photo-curable solution. The color mixed material dispersion-1 as produced above was added in to the photo-curable solution, and ground with a sand mill. During grinding, the solvent H-1 was supplemented so that the red photoresist composition comprised 19.01 wt % of the color mixed material and 37.657 wt % of the solvent H-1, thereby producing the red photoresist composition-1.

Examples 4 to 12

The red photoresist composition-2 to the red photoresist composition-12 were prepared by the same methods as EXAMPLES 2 and 3, respectively, except that the ratio of various components were shown in Table 1.

Application of the Red Photoresist Composition

The red photoresist composition-1 to the red photoresist composition-10 of Examples 3 to 12 were applied onto glass substrate by means of spin coating. The substrates coated with the red photoresist composition were baked at a temperature of 90° C., and then subject to UV radiation with an illuminance of 250 mJ/cm$^2$ for 25 seconds for exposing the aforesaid red photoresist composition. The exposed glass substrates were developed in a basic developer, and then baked at a temperature of 200° C. for 30 min, to form red sub-pixel patterns 1 to 10, which had a thickness of 1.5 μm.

Each formed red sub-pixel pattern was measured for its specific radiance of infrared light (with IRE-1 Type1 Infrared Radiation Measuring Instrument) and chromaticity (Shimadzu UV-2550), and the results were shown in Table 1 below, wherein "□" meant that the comprehensive performance was moderated, and "O" meant the comprehensive performance was good.

TABLE 1

| Examples | | | 3 | 4 | 5 | 6 | 7 | 8 | 9 | 10 | 11 | 12 |
|---|---|---|---|---|---|---|---|---|---|---|---|---|
| Color | Colorant (%) | P.R. 254 | 19 | 17.5 | 10 | 9 | 8 | 8 | 8 | 7 | 2.5 | 2 |
| Mixed | Infrared | B-1 | | 0.5 | 5 | 3 | 2 | | 2 | 3 | | |
| Material | light-emitting | B-2 | | | | | | | | | | |
| | material (%) | B-3 | 0.01 | 1 | 3 | 3 | 5 | 5 | 2 | | 2.5 | 1 |
| Solvent (%) | | H-1 | 37.657 | 17.67 | 28.476 | 22.478 | 29.485 | 30.48 | 30.48 | 22.483 | 34.977 | 28.98 |
| | | H-2 | 20 | 20 | 31 | 20 | 23 | 25 | 25 | 35 | 20 | 30 |
| | | H-3 | | 20 | | 20 | 10 | 9 | 10 | 10 | 10 | 10 |
| Alkali-soluble resin (%) | | D-1 | 5 | 9.5 | | 6 | | 5 | 5 | 8 | 10 | 5 |
| | | D-2 | 4.5 | | 9.5 | 3.5 | 9.5 | 4.5 | 4.5 | 1.5 | 5 | 8 |
| Ethenoid unsaturated | | E-1 | | 13.8 | 3 | 8 | 6 | 3 | 3 | 5 | 3 | 8 |
| monomer (%) | | E-2 | 13.8 | | 10 | 5 | 7 | 10 | 10 | 8 | 12 | 7 |
| Photo-initiator (%) | | G-1 | | 0.010 | | 0.006 | | 0.005 | 0.002 | 0.004 | 0.008 | 0.003 |
| | | G-2 | 0.015 | 0.005 | 0.014 | 0.006 | 0.010 | 0.005 | 0.008 | 0.008 | 0.010 | 0.012 |
| Other Additives (%) | | F-1 | 0.006 | 0.005 | 0.002 | 0.002 | 0.001 | 0.002 | 0.002 | 0.001 | 0.001 | 0.002 |
| | | F-2 | 0.006 | 0.010 | | | 0.004 | 0.004 | | 0.004 | | |
| | | F-3 | 0.006 | | 0.008 | 0.008 | | 0.004 | 0.008 | | 0.004 | 0.003 |
| Performance | Specific radiance of infrared light | | 0.10 | 0.49 | 0.86 | 0.8 | 0.82 | 0.75 | 0.66 | 0.59 | 0.52 | 0.42 |
| | Transmission (%) | | 89.1 | 90.2 | 95.3 | 95.4 | 95.7 | 96 | 95.9 | 96.3 | 99.3 | 99.40 |
| | Chromaticity (x, y) | | 0.651, | 0.647, | 0.635, | 0.634, | 0.632, | 0.633, | 0.632, | 0.631, | 0.616, | 0.614, |
| | (T = 1.5 um) | | 0.329 | 0.329 | 0.328 | 0.328 | 0.323 | 0.324 | 0.323 | 0.324 | 0.323 | 0.323 |
| Comprehensive effect | | | Δ | Δ | O | O | O | O | O | O | Δ | Δ |

It can be seen from the results as shown in Table 1 that when the content of the color mixed material is 5% or less (e.g., Examples 11 and 12), the specific radiance of infrared light of the red sub-pixel pattern is relatively low, while the color coordinate x is relatively small, thereby resulting in that the chromaticity of the red sub-pixel pattern and the comprehensive effect of emitting infrared light is relative poor. When the content of the color mixed material is greater than 18% and the ratio of colorant to the infrared material is 17.5:1.5 or greater (e.g., in Examples 3 and 4), the transmission is relative low, and the specific radiance of infrared light is relative low, thereby resulting in that the comprehensive effect is relatively poor.

When the content of infrared light-emitting material in the color mixed material is low, the specific radiance of infrared light of the photoresist is also low. With the increasing of the content of infrared light-emitting material in the color mixed material, the specific radiance of infrared light of the photoresist increases, but does not yet result in remarkable effect on the optical density of the photoresist material.

Effect of Infrared Light-Emitting Materials with and without Surface Modification on the Stability of the Photoresist Comparative Example 1

5 g of a dispersant, BYK 161, was added into 95 g of a solvent, propylene glycol monomethyl ether acetate (PMA), and then 11.1 g of alumina particles were added. The resultant mixture was stirred to be homogeneous, and ground in a sand mill to the extent that the mean particle diameter of alumina is 17 nm, thereby produce an alumina nano-dispersion. The alumina nano-dispersion was subject to removal of solvent, thereby producing alumina nanoparticles.

The red pigment P.R. 254 was mixed with the aforesaid alumina nanoparticles at a weight ratio of 99.05:0.05 to produce a color mixed material.

The comparative red photoresist composition was prepared in accordance with the method of Example 3.

The two red photoresist compositions of Example 3 and Comparative Example 1 were placed under shade environment at 0 to 4° C., and then observed for the delamination and precipitation of the photoresist composition.

The comparative red photoresist composition: after 24 hours, there were crusting on the surface and some precipitates at the bottom of the containment; and after 48 hours, there appeared a large amount of agglomerates with stirring, and solid particles agglomerated seriously.

The red photoresist composition-1: Until 48 hours, there appeared no crusting on the surface or precipitate at the bottom; while stirring did not result in caking or agglomeration.

Thus, it can be seen that the red photoresist composition capable of emitting infrared light of the embodiments of the present invention can emit far-infrared light having a health caring effect while maintaining conventional display properties due to the incorporation of surface-modified infrared light-emitting material nanoparticles.

The invention claimed is:

1. A red photoresist composition capable of emitting infrared light, wherein the red photoresist composition capable of emitting infrared light comprising, based on the total weight of the composition:
2% to 20% of a color mixed material, 30% to 90% of a solvent, 2% to 20% of an alkali-soluble resin, 2% to 20% of an ethenoid unsaturated monomer, 0.01% to 1% of a photoinitiator, and 0.005% to 0.02% of other additives;
wherein, the color mixed material comprises a colorant and surface-modified infrared light-emitting material at a weight ratio of 99.95:0.05 to 1:1.

2. The red photoresist composition capable of emitting infrared light of claim 1, wherein the color mixed material comprises 5 to 18 wt % of the total weight of the composition.

3. The red photoresist composition capable of emitting infrared light of claim 1, wherein the color mixed material comprises the colorant and the surface-modified infrared light-emitting material at a weight ratio of 17.5:1.5 to 1:1.

4. The red photoresist composition capable of emitting infrared light of claim 3, wherein the color mixed material comprises the colorant and the surface-modified infrared light-emitting material at a weight ratio of 10:1 to 1:1.

5. The red photoresist composition capable of emitting infrared light of claim 1, wherein the infrared light-emitting material is one or more selected from the group consisting of tourmaline, biological carbon, far-infrared ceramics, bowlder powders, alumina, copper oxide, silver oxide and silicon carbide.

6. The red photoresist composition capable of emitting infrared light of claim 5, wherein the infrared light-emitting material is subject to surface modification with a polymeric material.

7. The red photoresist composition capable of emitting infrared light of claim 6, wherein the polymeric material is a methyl methacrylate-co-styrene-co-maleimide copolymer.

8. The red photoresist composition capable of emitting infrared light of claim 5, wherein the tourmaline is red tourmaline having a density of 3.06 to 3.26 g/cm$^3$ and a refraction index of 1.62 to 1.64.

9. The red photoresist composition capable of emitting infrared light of claim 1, wherein the surface-modified infrared light-emitting material has a mean particle diameter of 1 nm to 200 nm.

10. A color filter, comprising red sub-pixels formed from the red photoresist composition capable of emitting infrared light of claim 1.

11. A display device comprising the color filter of claim 10.

12. The color filter of claim 10, wherein the color mixed material comprises the colorant and the surface-modified infrared light-emitting material at a weight ratio of 17.5:1.5 to 1:1.

13. The color filter of claim 10, wherein the infrared light-emitting material is one or more selected from the group consisting of tourmaline, biological carbon, far-infrared ceramics, bowlder powders, alumina, copper oxide, silver oxide and silicon carbide.

14. The color filter of claim 13, wherein the infrared light-emitting material is subject to surface modification with a polymeric material.

15. The color filter of claim 14, wherein the polymeric material is a methyl methacrylate-co-styrene-co-maleimide copolymer.

16. The color filter of claim 13, wherein the tourmaline is red tourmaline having a density of 3.06 to 3.26 g/cm$^3$ and a refraction index of 1.62 to 1.64.

17. The color filter of claim 10, wherein the surface-modified infrared light-emitting material has a mean particle diameter of 1 nm to 200 nm.

18. A method of preparing a red photoresist composition capable of emitting infrared light comprising:
grinding and dispersing an infrared light-emitting material into a solvent to give a nano-dispersion comprising infrared light-emitting material nanoparticles having a mean particle diameter of 1 nm to 200 nm;
modifying the infrared light-emitting material nanoparticles in the nano-dispersion with a polymeric material, followed by removing the solvent, to give polymeric material-modified infrared light-emitting material nanoparticles;
mixing the polymeric material modified infrared light-emitting material nanoparticles with a colorant to give a color mixed material, and
mixing the color mixed material with a solvent, an alkali-soluble resin, an ethenoid an unsaturated monomer, a photoinitiator, and other additives, to give the red photoresist composition capable of emitting infrared light.

19. The method of preparing the red photoresist composition capable of emitting infrared light of claim 18, wherein the infrared light-emitting material is one or more selected from the group consisting of tourmaline, biological carbon, far-infrared ceramics, bowlder powders, alumina, copper oxide, silver oxide and silicon carbide.

20. The method of preparing the red photoresist composition capable of emitting infrared light of claim 18, wherein the polymeric material is a methyl methacrylate-co-styrene-co-maleimide copolymer.

\* \* \* \* \*